(12) United States Patent
Kaneko

(10) Patent No.: US 8,218,388 B2
(45) Date of Patent: Jul. 10, 2012

(54) READ CIRCUIT FOR SEMICONDUCTOR MEMORY DEVICE AND SEMICONDUCTOR MEMORY DEVICE

(75) Inventor: Tetsuya Kaneko, Chiba (JP)

(73) Assignee: Seiko Instruments Inc. (JP)

( * ) Notice: Subject to any disclaimer, the term of this patent is extended or adjusted under 35 U.S.C. 154(b) by 359 days.

(21) Appl. No.: 12/614,909

(22) Filed: Nov. 9, 2009

(65) Prior Publication Data

US 2010/0118624 A1 May 13, 2010

(30) Foreign Application Priority Data

Nov. 12, 2008 (JP) .............................. JP2008-289480

(51) Int. Cl.
*G11C 7/00* (2006.01)
(52) U.S. Cl. .... 365/221; 365/220; 365/219; 365/230.06
(58) Field of Classification Search .................. 365/221, 365/220, 219, 230.06
See application file for complete search history.

(56) References Cited

U.S. PATENT DOCUMENTS

| 5,359,556 | A | 10/1994 | Kimura et al. |
| 6,038,185 | A * | 3/2000 | Ng et al. ........................ 365/221 |
| 6,693,818 | B2 * | 2/2004 | Shiga et al. ..................... 365/63 |
| 2009/0185442 | A1 * | 7/2009 | Pyeon et al. .................. 365/220 |

FOREIGN PATENT DOCUMENTS

| JP | 2002-515628 A | 5/2002 |
| WO | WO 99/59154 A1 | 11/1999 |

OTHER PUBLICATIONS

European Search Report from counterpart European Application No. 09175332.7, dated Feb. 26, 2010, 7 pages.

* cited by examiner

*Primary Examiner* — Vu Le
*Assistant Examiner* — Han Yang
(74) *Attorney, Agent, or Firm* — Brinks Hofer Gilson & Lione

(57) ABSTRACT

Provided is a read circuit for a semiconductor memory device which may have a reduced circuit scale, and a semiconductor memory device. In a plurality of sense amplifiers of the read circuit of the semiconductor memory device, for serially reading data from a serial output terminal, if a number of byte selectors which may be selected to determine an address at a predetermined time before determination of the address is four, only four sense amplifiers are required in total, and hence the read circuit and the semiconductor memory device are reduced in circuit scale.

7 Claims, 4 Drawing Sheets

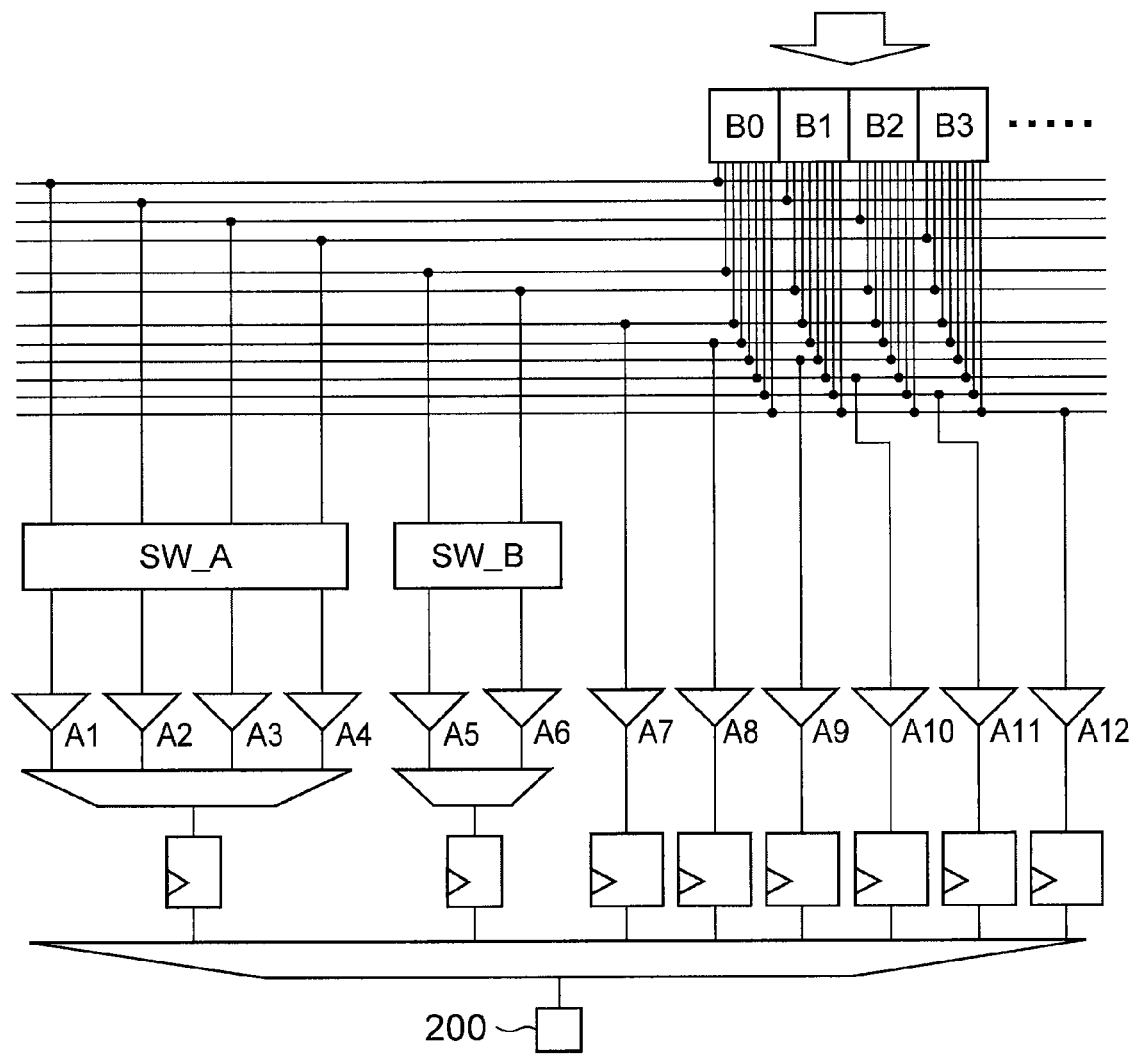

READ CIRCUIT FOR SEMICONDUCTOR MEMORY DEVICE AND SEMICONDUCTOR MEMORY DEVICE

RELATED APPLICATIONS

This application claims priority under 35 U.S.C. §119 to Japanese Patent Application No. 2008-289480 filed on Nov. 12, 2008, the entire content of which is hereby incorporated by reference.

BACKGROUND OF THE INVENTION

1. Field of the Invention

The present invention relates to a read circuit for a semiconductor memory device, for serially reading data from a serial output terminal, and a semiconductor memory device.

2. Description of the Related Art

A semiconductor memory device is now frequently required to operate at high speed. With the high-speed operation, data are frequently required to be read from memory cells at high speed.

A conventional read circuit for a semiconductor memory device, for serially reading data from a serial output terminal is described. FIG. 4 illustrates the conventional read circuit.

When an address signal except for low-order two bits of a plurality of bits necessary to determine an address is input before the determination of the address, a switch circuit SW_A and sense amplifiers A1 to A4 are used and simultaneously a plurality of data signals D7 are read. After that, when an address signal except for low-order one bit of a plurality of bits necessary to determine the address is input before the determination of the address, a switch circuit SW_B and sense amplifiers A5 and A6 are used and simultaneously a plurality of data signals D6 are read.

When an address signal of all bits necessary to determine the address is input after the determination of the address, sense amplifiers A7 to A12 are used and simultaneously data signals D5 to D0 are read. The data signals D7 and D6 selected from the plurality of data signals D7 and D6 and the data signals D5 to D0 are sequentially read from a serial output terminal 200 (see, for example, Japanese Patent Translation Publication No. 2002-515628).

However, the conventional read circuit requires the four sense amplifiers A1 to A4 for reading the plurality of data signals D7, the two sense amplifiers A5 and A6 for reading the plurality of data signals D6, and the six sense amplifiers A7 to A12 for reading the data signals D5 to D0. In other words, 12 sense amplifiers are required in total, and hence a circuit scale is increased.

SUMMARY OF THE INVENTION

The present invention has been made in view of the problem described above. An object of the present invention is to provide a read circuit for a semiconductor memory device which may have a reduced circuit scale, and a semiconductor memory device.

In order to solve the above-mentioned problem, the present invention provides a read circuit for a semiconductor memory device, for serially reading data from a serial output terminal, including: a plurality of byte selectors each for outputting first to eighth data signals from a plurality of predetermined memory cells based on an address; a plurality of sense amplifiers for simultaneously sensing the first data signals from the plurality of byte selectors which may be selected to determine the address before the address is determined, and sensing the second to eighth data signals from one of the plurality of byte selectors which corresponds to a determined address when the address is determined; and a selector circuit for selectively reading one of the first data signals which is sensed by the one of the plurality of byte selectors which corresponds to the determined address after the address is determined, and sequentially selectively reading the second to eighth data signals from the one of the plurality of byte selectors.

Further, in order to solve the above-mentioned problem, the present invention provides a semiconductor memory device, including: a row decoder; a column decoder; a memory array including a plurality of memory cells arranged in rows and an output bit line, at least one of the plurality of memory cells which is located in a predetermined row being selected by the row decoder and the column decoder; a control circuit including an output signal line, for capturing an instruction and address data which are included in an input signal and making an access to at least one of the plurality of memory cells which is located in a row corresponding to the address data through the row decoder and the column decoder; and a read circuit connected to the output bit line of the memory array and the output signal line of the control circuit, for serially outputting data from the at least one of the plurality of memory cells which is located in the row corresponding to the address data, in which the read circuit includes: a plurality of byte selectors connected to the output bit line, for outputting data from at least two of the memory cells which are located in rows which may correspond to determined address data before the address data is determined; a plurality of sense amplifiers connected to the plurality of byte selectors on a one-to-one basis; a plurality of switch circuits provided between the plurality of byte selectors and the plurality of sense amplifiers; and a selector circuit connected to the plurality of sense amplifiers, for switching and outputting outputs from the plurality of sense amplifiers after the address data is determined, and in which after the address data is determined, a first data signal from one of the plurality of byte selectors which corresponds to the determined address data is selectively read by a first switch circuit of the plurality of switch circuits, and then second and subsequent data signals are sequentially selectively read by the plurality of switch circuits.

According to the present invention, in the plurality of sense amplifiers of the read circuit of the semiconductor memory device, for serially reading the data from the serial output terminal, if the number of byte selectors which may be selected to determine the address at a predetermined time before the determination of the address is four, only four sense amplifiers are required in total, and hence the read circuit and the semiconductor memory device are reduced in circuit scale.

BRIEF DESCRIPTION OF THE DRAWINGS

In the accompanying drawings:

FIG. 4 is a circuit diagram illustrating a read circuit of a conventional semiconductor memory device.

DETAILED DESCRIPTION OF THE PREFERRED EMBODIMENTS

Hereinafter, an embodiment of the present invention is described with reference to the attached drawings.

Figure 1:
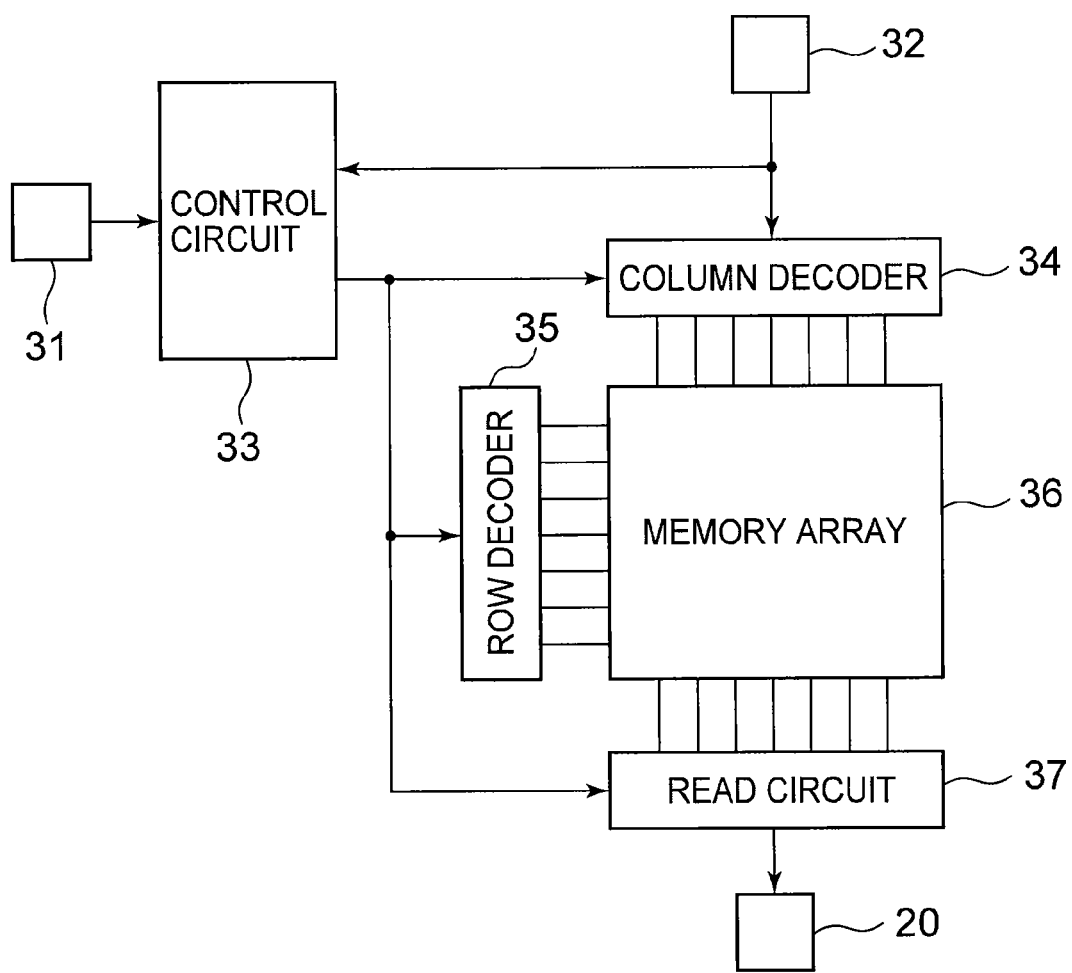
FIG. 1 is a circuit diagram illustrating a semiconductor memory device according to the present invention.

First, a structure of a semiconductor memory device is described. FIG. 1 illustrates the semiconductor memory device.

The semiconductor memory device includes a clock terminal 31, a serial input terminal 32, and a serial output terminal 20. The semiconductor memory device further includes a control circuit 33, a column decoder 34, a row decoder 35, a memory array 36, and a read circuit 37. The memory array 36 includes a plurality of memory cells.

An input signal from the serial input terminal 32 is input to the control circuit 33 and the column decoder 34. A clock signal is input to the control circuit 33. The control circuit 33 controls the column decoder 34, the row decoder 35, and the read circuit 37. The column decoder 34, the row decoder 35, and the read circuit 37 are connected to the memory array 36 for each of the plurality of memory cells of the memory array 36. The read circuit 37 outputs data to the serial output terminal 20.

Next, an operation of the semiconductor memory device is described.

The control circuit 33 captures the input signal from the serial input terminal 32 in synchronization with the clock signal input to the clock terminal 31. The input signal includes an instruction, an address, and data. The control circuit 33 recognizes the instruction and the address and makes an access to a predetermined memory cell of the memory array 36 corresponding to the intended address through the row decoder 35 and the column decoder 34 to select the memory cell. After that, the data is written to the memory cell.

The control circuit 33 captures the input signal from the serial input terminal 32 in synchronization with the clock signal input to the clock terminal 31. The input signal includes an instruction and an address. The control circuit 33 recognizes the instruction and the address and makes an access to a predetermined memory cell of the memory array 36 corresponding to the intended address through the row decoder 35 and the column decoder 34 to select the memory cell. After that, the data is read from the memory cell to the read circuit 37. The data is output from the serial output terminal 20.

Figure 2:
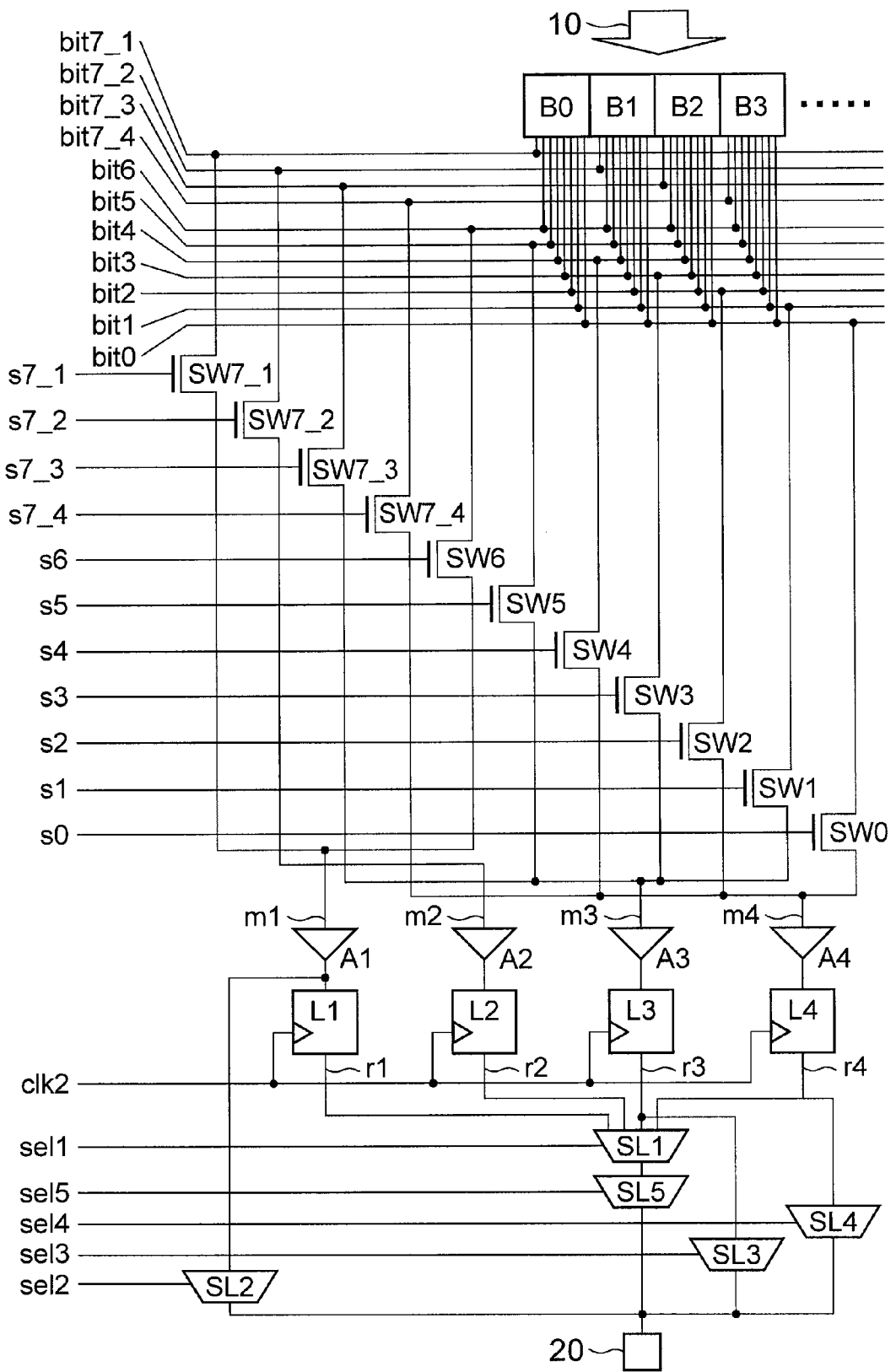
FIG. 2 is a circuit diagram illustrating a read circuit of the semiconductor memory device according to the present invention.

Next, a structure of the read circuit 37 is described. FIG. 2 illustrates the read circuit.

The read circuit 37 includes typical signal lines, that is, a bus bit line 10, bit lines bit0 to bit6, and bit lines bit7_1 to bit7_4. The read circuit 37 further includes byte selectors B0 to B3, switches SW0 to SW6, switches SW7_1 to SW7_4, sense amplifiers A1 to A4, latches L1 to L4, and selectors SL1 to SL5.

The byte selectors B0 to B3 are connected to the bus bit line 10. The byte selector B0 includes 0th to 6th output terminals connected to the bit lines bit0 to bit6, respectively, and a 7th output terminal connected to the bit line bit7_1. The byte selector B1 includes 0th to 6th output terminals connected to the bit lines bit0 to bit6, respectively, and a 7th output terminal connected to the bit line bit7_2. The byte selector B2 includes 0th to 6th output terminals connected to the bit lines bit0 to bit6, respectively, and a 7th output terminal connected to the bit line bit7_3. The byte selector B3 includes 0th to 6th output terminals connected to the bit lines bit0 to bit6, respectively, and a 7th output terminal connected to the bit line bit7_4. The switch SW0 is provided between the bit line bit0 and an input terminal of the sense amplifier A4. The switch SW1 is provided between the bit line bit1 and an input terminal of the sense amplifier A3. The switch SW2 is provided between the bit line bit2 and the input terminal of the sense amplifier A4. The switch SW3 is provided between the bit line bit3 and the input terminal of the sense amplifier A3. The switch SW4 is provided between the bit line bit4 and the input terminal of the sense amplifier A4. The switch SW5 is provided between the bit line bit5 and the input terminal of the sense amplifier A3. The switch SW6 is provided between the bit line bit6 and an input terminal of the sense amplifier A1. The switch SW7_1 is provided between the bit line bit7_1 and the input terminal of the sense amplifier A1. The switch SW7_2 is provided between the bit line bit7_2 and an input terminal of the sense amplifier A2. The switch SW7_3 is provided between the bit line bit7_3 and the input terminal of the sense amplifier A3. The switch SW7_4 is provided between the bit line bit7_4 and the input terminal of the sense amplifier A4. Signals s0 to s6 are input to gates of the switches SW0 to SW6. Signals s7_1 to s7_4 are input to gates of the switches SW7_1 to SW7_4. Output terminals of the sense amplifiers A1 to A4 are connected to input terminals of the latches L1 to L4. A signal clk2 is input to each of clock terminals of the latches L1 to L4. The selector SL1 includes a first input terminal connected to an output terminal of the latch L1, a second input terminal connected to an output terminal of the latch L2, a third input terminal connected to an output terminal of the latch L3, and a fourth input terminal connected to an output terminal of the latch L4. The selector SL2 includes an input terminal connected to the output terminal of the sense amplifier A1. The selector SL3 includes an input terminal connected to the output terminal of the latch L3. The selector SL4 includes an input terminal connected to the output terminal of the latch L4. The selector SL5 includes an input terminal connected to an output terminal of the selector SL1. Signals sel1 to sel5 are input to control terminals of the selectors SL1 to SL5. Output terminals of the selectors SL2 to SL5 are connected to the serial output terminal 20.

The byte selectors B0 to B3 each output data signals D7 to D0 from a plurality of predetermined memory cells based on an address. The sense amplifiers A1 to A4 simultaneously sense the respective data signals D7 from the byte selectors B0 to B3 which may be selected to determine the address before the determination of the address, simultaneously sense the data signals D6 to D4 from the byte selector corresponding to the determined address, simultaneously sense the data signals D3 and D2 from the byte selector corresponding to the determined address, and simultaneously sense the data signals D1 and D0 from the byte selector corresponding to the determined address. The latches L1 to L4 latch respective signals from the sense amplifiers A1 to A4. After the determination of the address, the selectors SL1 to SL5 selectively read the data signal D7 from the byte selector corresponding to the determined address, of the respective data signals D7 and sequentially selectively read the data signals D6 to D0.

The semiconductor memory device is electrically rewritable and includes, for example, an electrically erasable programmable read only memory (EEPROM).

Figure 3:
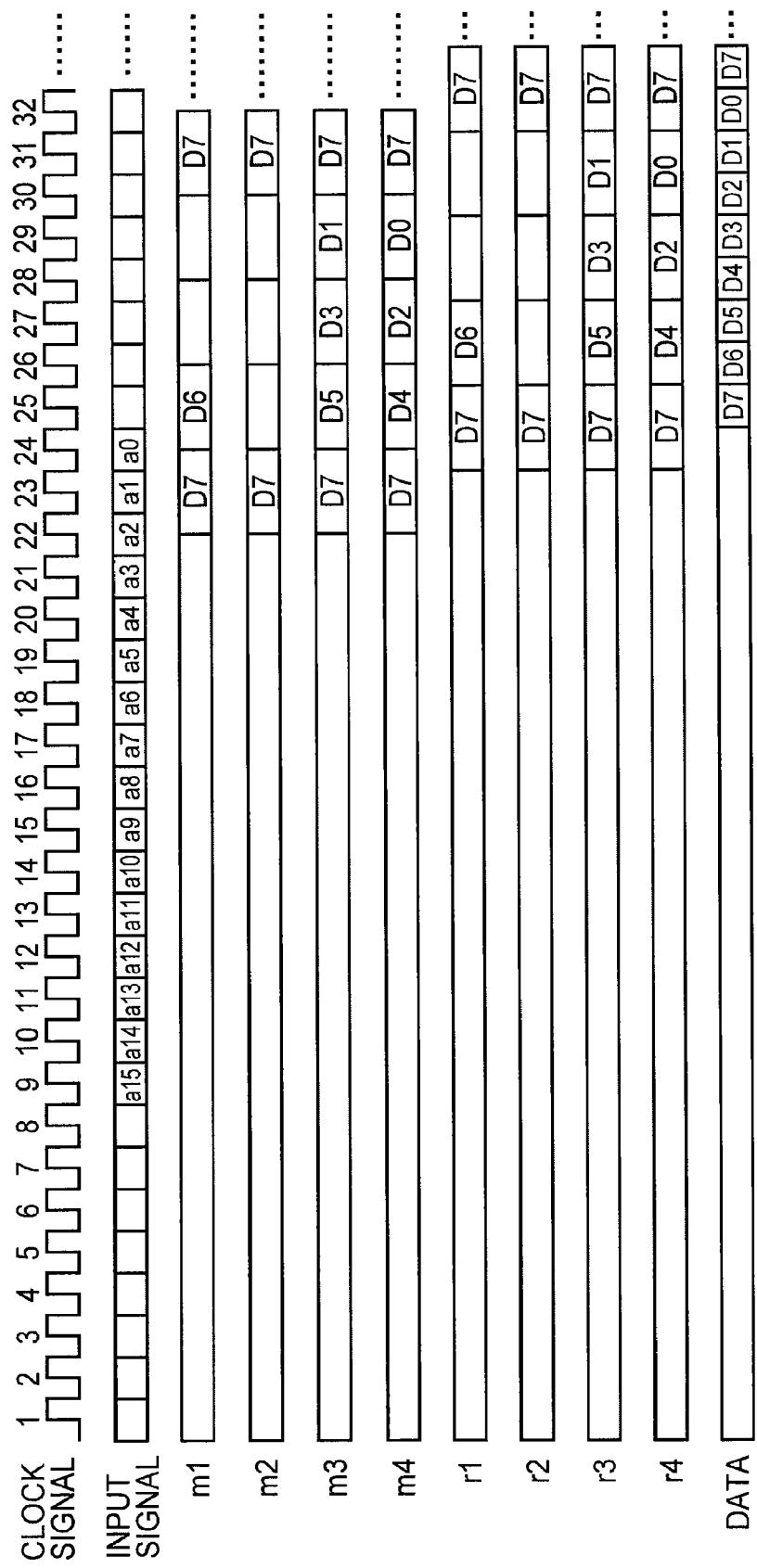
FIG. 3 is a timing chart illustrating signals including data from a serial output terminal.

Next, an operation of the read circuit 37 is described. FIG. 3 is a timing chart illustrating signals including data from the serial output terminal.

The instruction is a total of eight instruction signals corresponding to eight clocks of first to eighth clock signals. The address is a total of 16 address signals a0 to a15 corresponding to 16 clocks of 9th to 24th clock signals. The data is a total of eight data signals D0 to D7 corresponding to eight clocks of 25th to 32nd clock signals.

The instruction signals are input to the control circuit 33 in response to the eight clocks of the first to eighth clock signals. The instruction is then determined at the rising edge of the eighth clock signal. The address signals are input to the control circuit 33 in response to the 16 clocks of the 9th to 24th clock signals. The address is then determined at the rising edge of the 24th clock signal. The data signals corresponding to the address are serially read from the serial output terminal 20 at the falling edges of the 24th to 31st clock signals.

The data signals on the bus bit line 10 are selected by the byte selectors B0 to B3 and output to the bit lines bit0 to bit6 or the bit lines bit7_1 to bit7_4. When the address signals a15 to a2 corresponding to the 14 clocks of the 9th to 22nd clock signals are input at the rising edge of the 22nd clock signal, that is, when the address signals a15 to a2 of high-order 14 bits other than low-order 2 bits, of 16 bits necessary to determine the address are input, the 14 bits are determined but the 2 bits are not determined. Therefore, the number of addresses which may be selected to determine the address before the determination of the address is 4 (=$2^2$). The control circuit 33 selects the byte selectors B0 to B3 corresponding to the four addresses. The byte selectors B0 to B3 output the respective data signals D7 corresponding to the four addresses to each of the bit lines bit7_1 to bit7_4. In this case, the control circuit 33 outputs the signals s0 to s6 and the signals s7_1 to s7_4 to turn off the switches SW0 to SW6 and turn on the switches SW7_1 to SW7_4. In other words, the bit lines bit7_1 to bit7_4 are connected to the input terminals of the sense amplifiers A1 to A4 through the switches SW7_1 to SW7_4. Therefore, at the rising edge of the 22nd clock signal, signals m1 to m4 input to the sense amplifiers A1 to A4 correspond to the respective data signals D7 from the byte selectors B0 to B3.

The signals m1 to m4 (respective data signals D7 from byte selectors B0 to B3) are held until the rising edge of the 24th clock signal because the switches SW0 to SW6 continue to be turned off and the switches SW7_1 to SW7_4 continue to be turned on. Then, the signals m1 to m4 are latched as signals r1 to r4 into the latches L1 to L4 at the falling edge of the 23rd clock signal in response to the signal clk2.

After that, the address is determined at the rising edge of the 24th clock signal. In this case, assume that the byte selector B0 corresponds to the determined address. Of the latched respective data signals D7 from the byte selectors B0 to B3, the data signal D7 from the byte selector B0 (signal r1 from latch L1) is output from the serial output terminal 20 through the selectors SL1 and SL5 in response to the signals sel1 to sel5 at the falling edge of the 24th clock signal.

After that, the control circuit 33 outputs the signals s0 to s6 and the signals s7_1 to s7_4 to turn on the switches SW4 to SW6 and turn off the switches SW0 to SW3 and the switches SW7_1 to SW7_4. In other words, the bit lines bit6 to bit4 are connected to the input terminals of the sense amplifiers A1, A3, and A4 through the switches SW6 to SW4, respectively. Therefore, at the rising edge of the 24th clock signal, the signals m1, m3, and m4 input to the sense amplifiers A1, A3, and A4 correspond to the data signals D6 to D4 from the byte selector B0, respectively.

The signals m1, m3, and m4 (data signals D6 to D4 from byte selector B0) are held until the rising edge of the 26th clock signal because the switches SW4 to SW6 continue to be turned on and the switches SW0 to SW3 and the switches SW7_1 to SW7_4 continue to be turned off. Then, the signals m1, m3, and m4 are latched as signals r1, r3, and r4 into the latches L1, L3, and L4, respectively, at the falling edge of the 25th clock signal in response to the signal clk2.

At the falling edge of the 25th clock signal, the data signal D6 from the byte selector B0 (signal input to latch L1) is latched into the latch L1 and output form the serial output terminal 20 through the selector SL2 in response to the signal sel2. Then, at the falling edge of the 26th clock signal, the data signal D5 from the byte selector B0 (signal r3 from latch L3) is output from the serial output terminal 20 through the selector SL3 in response to the signals sel1 to sel5. Then, at the falling edge of the 27th clock signal, the data signal D4 from the byte selector B0 (signal r4 from latch L4) is output from the serial output terminal 20 through the selector SL4 in response to the signals sel1 to sel5.

After that, the control circuit 33 outputs the signals s0 to s6 and the signals s7_1 to s7_4 to turn on the switches SW2 and SW3 and turn off the switches SW0, SW1, SW4 to SW6, and SW7_1 to SW7_4. In other words, the bit lines bit3 and bit2 are connected to the input terminals of the sense amplifiers A3 and A4 through the switches SW3 and SW2, respectively. Therefore, at the rising edge of the 26th clock signal, the signals m3 and m4 input to the sense amplifiers A3 and A4 correspond to the data signals D3 and D2 from the byte selector B0, respectively.

The signals m3 and m4 (data signals D3 and D2 from byte selector B0) are held until the rising edge of the 28th clock signal because the switches SW2 and SW3 continue to be turned on and the switches SW0, SW1, SW4 to SW6, and SW7_1 to SW7_4 continue to be turned off. Then, the signals m3 and m4 are latched as signals r3 and r4 into the latches L3 and L4, respectively, at the falling edge of the 27th clock signal in response to the signal clk2.

At the falling edge of the 28th clock signal, the data signal D3 from the byte selector B0 (signal r3 from latch L3) is output from the serial output terminal 20 through the selector SL3 in response to the signals sel1 to sel5. Then, at the falling edge of the 29th clock signal, the data signal D4 from the byte selector B0 (signal r4 from latch L4) is output from the serial output terminal 20 through the selector SL4 in response to the signals sel1 to sel5.

As in the case of the operation with respect to the data signals D3 and D2, at the falling edge of the 30th clock signal, the data signal D1 from the byte selector B0 (signal r3 from latch L3) is output from the serial output terminal 20 through the selector SL3 in response to the signals sel1 to sel5. Then, at the falling edge of the 31st clock signal, the data signal D0 from the byte selector B0 (signal r4 from latch L4) is output from the serial output terminal 20 through the selector SL4 in response to the signals sel1 to sel5.

Therefore, in the case of the plurality of sense amplifiers of the read circuit 37 for serially reading the data from the serial output terminal 20 of the semiconductor memory device, when the number of byte selectors which may be selected to determine the address at a predetermined time before the determination of the address is four, only the four sense amplifiers A1 to A4 are required in total, and hence the read circuit 37 and the semiconductor memory device are reduced in circuit scale.

When the high-speed operation is required and thus data is to be read after a lapse of ½ of the clock signal period from the determination of the address, a read processing time of each of the sense amplifiers is more likely to be longer than ½ of the clock signal period. However, as illustrated in FIG. 3, the read processing time of each of the sense amplifiers is equal to 3/2 of the clock signal period. Therefore, the read circuit 37 and the semiconductor memory device are easily operated at high speed.

For the convenience of description, the four byte selectors are illustrated. To be specific, when the address signals a15 to a2 of high-order 14 bits other than low-order 2 bits, of the 16 bits necessary to determine the address are input, the 14 bits are determined but the 2 bits are not determined. Therefore, the number of addresses which may be selected to determine the address before the determination of the address is 4 (=$2^2$).

Only the byte selectors B0 to B3 corresponding to the four addresses are illustrated. The four sense amplifiers are provided corresponding to the byte selectors B0 to B3.

There may be a case where the address signals a15 to a3 of high-order 13 bits other than low-order 3 bits are input and thus the number of addresses which may be selected to determine the address before the determination of the address is 8 ($=2^3$). The eight addresses correspond to eight byte selectors, and hence eight sense amplifiers may be provided corresponding to the eight byte selectors.

What is claimed is:

1. A read circuit for a semiconductor memory device, for serially reading data from a serial output terminal, comprising:
   a plurality of byte selectors each for outputting first to eighth data signals from a plurality of predetermined memory cells based on an address;
   a plurality of sense amplifiers for simultaneously sensing the first data signals from the plurality of byte selectors which are selected to determine the address before the address is determined, and sensing the second to eighth data signals from one of the plurality of byte selectors which corresponds to a determined address when the address is determined; and
   a selector circuit for selectively reading one of the first data signals which is sensed by the one of the plurality of byte selectors which corresponds to the determined address after the address is determined, and sequentially selectively reading the second to eighth data signals from the one of the plurality of byte selectors;
   wherein the plurality of sense amplifiers simultaneously sense the first data signals from the plurality of byte selectors which are selected to determine the address before the address is determined, simultaneously sense second to fourth data signals from the one of the plurality of byte selectors which corresponds to the determined address, simultaneously sense fifth and sixth data signals from the one of the plurality of byte selectors which corresponds to the determined address, and simultaneously sense seventh and eighth data signals from the one of the plurality of byte selectors which corresponds to the determined address.

2. A read circuit for a semiconductor memory device according to claim 1, wherein, before the address is determined, an address signal except for low-order two bits of a plurality of bits necessary to determine the address is input.

3. A read circuit for a semiconductor memory device according to claim 2, wherein the four sense amplifiers are provided.

4. A read circuit for a semiconductor memory device according to claim 1, further comprising a plurality of latches for latching signals from the plurality of sense amplifiers.

5. A read circuit for a semiconductor memory device according to claim 1, further comprising a switch circuit provided between the plurality of byte selectors and the plurality of sense amplifiers.

6. A read circuit for a semiconductor memory device according to claim 1, wherein the semiconductor memory device is electrically rewritable.

7. A semiconductor memory device, comprising:
   a row decoder;
   a column decoder;
   a memory array including a plurality of memory cells arranged in rows and an output bit line, at least one of the plurality of memory cells which is located in a predetermined row being selected by the row decoder and the column decoder;
   a control circuit including an output signal line, for capturing an instruction and address data which are included in an input signal and making an access to at least one of the plurality of memory cells which is located in a row corresponding to the address data through the row decoder and the column decoder; and
   a read circuit connected to the output bit line of the memory array and the output signal line of the control circuit, for serially outputting data from the at least one of the plurality of memory cells which is located in the row corresponding to the address data,
   wherein the read circuit comprises:
      a plurality of byte selectors connected to the output bit line, for outputting data from at least two of the memory cells which are located in rows which correspond to determined address data before the address data is determined;
      a plurality of sense amplifiers connected to the plurality of byte selectors on a one-to-one basis;
      a plurality of switch circuits provided between the plurality of byte selectors and the plurality of sense amplifiers; and
      a selector circuit connected to the plurality of sense amplifiers, for switching and outputting outputs from the plurality of sense amplifiers after the address data is determined,
   wherein after the address data is determined, a first data signal from one of the plurality of byte selectors which corresponds to the determined address data is selectively read by a first switch circuit of the plurality of switch circuits, and then second and subsequent data signals are sequentially selectively read by the plurality of switch circuits;
   wherein the plurality of sense amplifiers simultaneously sense first data signals from the plurality of byte selectors which are selected to determine the address before the address is determined, simultaneously sense second to fourth data signals from the one of the plurality of byte selectors which corresponds to the determined address, simultaneously sense fifth and sixth data signals from the one of the plurality of byte selectors which corresponds to the determined address, and simultaneously sense seventh and eighth data signals from the one of the plurality of byte selectors which corresponds to the determined address.

* * * * *